United States Patent [19]

Hakala

[11] 4,255,504
[45] Mar. 10, 1981

[54] METHOD FOR PRODUCING CRT SCREEN STRUCTURE

[75] Inventor: David F. Hakala, Lancaster, Pa.

[73] Assignee: RCA Corporation, New York, N.Y.

[21] Appl. No.: 60,030

[22] Filed: Jul. 23, 1979

[51] Int. Cl.$^3$ ............................................. G03C 5/00
[52] U.S. Cl. ............................... 430/28; 204/159.23; 430/25; 430/270; 430/274; 430/325; 430/909; 430/915
[58] Field of Search ................ 430/25, 28, 270, 274, 430/325, 909, 915; 204/159.23

[56] References Cited

U.S. PATENT DOCUMENTS

| 3,074,794 | 1/1963 | Oster et al. | 430/270 |
| 3,558,310 | 1/1971 | Mayaud | 430/25 |
| 4,049,452 | 9/1977 | Nekut | 430/28 |

FOREIGN PATENT DOCUMENTS 1472037  4/1977  United Kingdom.

*Primary Examiner*—Edward C. Kimlin
*Attorney, Agent, or Firm*—E. M. Whitacre; G. H. Bruestle; L. Greenspan

[57] ABSTRACT

Additions of fluorescein or a fluorescein salt and a diol to a photosensitized polymeric material increase the photosensitivity thereof in a method for photodepositing a luminescent-screen structure for a cathode-ray tube.

10 Claims, No Drawings

METHOD FOR PRODUCING CRT SCREEN STRUCTURE

BACKGROUND OF THE INVENTION

This invention relates to a novel method for preparing a screen structure for a CRT (cathode-ray tube) and particularly, but not exclusively, to a novel method for preparing a light-absorbing matrix for a color-television-picture tube.

Some color-television-picture tubes include, as a structural part of the luminescent viewing screen, a light-absorbing matrix located on the inner surface of the faceplate of the tube. The matrix has a multiplicity of openings therein, which may be in the shape of dots or lines, with phosphor filling each opening in the matrix. A reverse-printing method for preparing a light-absorbing matrix for a CRT is described in U.S. Pat. No. 3,558,310 issued Jan. 26, 1971 to E. E. Mayaud. In a preferred embodiment of that method, the inner surface of the faceplate of a CRT is coated with a film of clear water-based photosensitive material, typically a dichromate-sensitized polyvinyl alcohol. A light image is projected on the film to insolubilize selected regions of the film. The film is flushed with water to remove the still-soluble regions of the film while retaining the insolubilized regions in place. Then, the developed film is overcoated with a layer containing particles of screen structure material, such as graphite. Finally, the retained film regions are removed together with the overlying overcoating, while retaining those portions of the overcoating in the regions previously occupied by removed still-soluble portions of the film. Such a process produces satisfactory screen structures, although further improvements in the process are desirable, for example, by providing shorter exposure times for the film and better definition of the structure.

Further improvements towards this end are disclosed in U.S. Pat. No. 4,049,452 issued Sept. 20, 1977 to E. M. Nekut. The method disclosed in the Nekut patent is similar to the method disclosed in the Mayaud patent except that the film contains 5 to 80 weight percent of at least one diol from a specified group.

SUMMARY OF THE INVENTION

In the novel method, a support surface is coated with a film of a photosensitive polymeric material containing at least one member of a first group consisting of diol alkanes and diol ethers, and at least one member of a second group consisting of fluorescein and water-soluble salts of fluorescein. The film is then exposed and developed to produce a polymeric image. Where the image contains phosphor particles, the image may be processed to complete the luminescent screen. Where the image is free from luminescent-screen-structure particles, the image may be overcoated with a composition containing particles of light-absorbing or other screen-structure material; and then the polymeric image and overlying coating are removed as described in the above-identified Mayaud patent. The process may be used to fabricate a light-absorbing matrix, or a phosphor pattern, or other screen structure.

By including at least one member of the first and second groups described above, the exposure time may be shortened to as little as 35 percent of the exposure required for similar films which do not include such member. The types of materials in the film do not cause light scattering or other optical effects which may be undesirable during the exposure step. Also, the formulations for preparing the film are stable chemically and exhibit good shelf life and pot life.

DESCRIPTION OF THE PREFERRED EMBODIMENTS

Generally, the details of the novel method are similar to those of the method described in the Nekut patent, op. cit., except for the film formulation. Modifications and alternatives, such as the use of light-scattering particles in the film described in U.S. Pat. No. 3,623,867 issued Nov. 30, 1971 to T. A. Saulnier; the limpstream-coating technique described in U.S. Pat. No. 3,652,323 issued Mar. 28, 1972 to B. K. Smith; and the print-down by under-exposure technique described in U.S. Pat. No. 3,788,846 issued Jan. 29, 1974 to E. E. Mayaud et al may also be used. Since these other details are already described in the prior art, a further discussion is unnecessary.

The film consists essentially of (i) fluorescein, which is an organic acid, and/or a fluorescein salt of that acid, (ii) at least one diol ether or diol alkane, and (iii) a polymeric material whose solubility in an aqueous solvent is altered when it is exposed to radiant energy. The preferred polymeric material is a polyvinyl alcohol containing an amount (usually about 2 to 30 weight percent with respect to the weight of the polyvinyl alcohol) of a photosensitizer, which may be a soluble dichromate, such as sodium dichromate, potassium dichromate or ammonium dichromate. Besides polyvinyl alcohol, other photosensitizable polymeric materials may be used. Some suitable materials are gelatin, albumin, starch, fish glue, gum arabic, polyvinyl pyrrolidone and certain acrylic acid derivatives.

The diol alkanes that can be used have the molecular formula

$$HO-CH_2-(CH_2)_m-CH_2-OH$$

where m is an integer in the range of 2 to 5. The diol ethers that can be used have the molecular formula

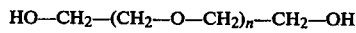
$$HO-CH_2-(CH_2-O-CH_2)_n-CH_2-OH$$

where n is in the range of 1 to 5. These materials, referred to herein as diols, generally have a molecular weight of less than 500. These diols are clear viscous liquids at room temperature. Examples are given in the cited Nekut patent. One or more of the diols is present in the film in concentrations of about 5 to 80 weight percent of the polymeric material. The preferred range is about 20 to 50 weight percent.

The polymeric material, a photosensitizer therefor and a diol ether and/or diol alkane are mixed with water. Fluorescein salts, such as sodium fluorescein, which are sufficiently water-soluble are dissolved in water and then added to the mixture. Fluorescein and fluorescein salts which are poorly soluble in water are dissolved in a water-miscible solvent, such as ethyl alcohol, and the solution is mixed into the aqueous mixture. The proportion of fluorescein and/or fluorescein salts is about 0.5 to 10 weight percent of the polymeric material. The mixture is coated on a support surface and then is dried. It is desirable that the film be smooth, unbroken and uncrazed, since this will produce the sharpest, cleanest graphic images. To this end, it is preferred that the polymeric material be film-forming either directly upon deposition or during a heating step subsequent to deposition. In many systems, the film-forming temperature can be tailored by adjusting the relative proportions of the ingredients constituting the film. The resistance of the film to the erosive action of the developer may be adjusted, if desired, by including in the film formulation a small amount of less water-sensitive polymer. For example, where the polymer material is principally polyvinyl alcohol, it is preferred to include a small amount of an acrylic polymer or copolymer. The proportion of acrylic polymer may be up to about 100 percent of the weight of the polyvinyl alcohol present in the film.

An example of the novel method for preparing a light-absorbing matrix on the inner surface of a faceplate of an aperture-mask-type color-television-picture tube will now be described. First, the inner surface of the faceplate for the tube is cleaned in the usual way as with water, ammonium bifluoride, hydrofluoric acid, detergent, caustic, etc. to remove any foreign matter. Then, the surface is coated with an aqueous mixture containing about:

| Ingredient | Weight Percent |
| --- | --- |
| Polyvinyl alcohol | 2.88 |
| Arcylic copolymer, such as Rhoplex AC-73 marketed by Rohm & Haas Chemical Co., Philadelphia, Pa. | 1.37 |
| Sodium dichromate dihydrate | 0.317 |
| 2.2' ethylene dioxy diethanol, such as the material marketed under the name triethylene glycol by Dow Chemical Company, Midland, Mich. | 0.864 |
| Sodium fluorescein | 0.043 |
| Water | balance to 100 |

The faceplate is rotated and tilted so that the solution spreads evenly over the surface. During the latter steps of rotation, infrared heat is applied so that the water in the solution evaporates and a dry film is formed on the surface.

An aperture mask for the faceplate is positioned above the film and the assembly is placed on a lighthouse, an apparatus designed to expose the film on the faceplate by projection of light through the mask. In this example, the mask has circular apertures with a diameter of about 13 mils and center-to-center spacing between apertures of about 28 mils near the center of the mask. The film is exposed for about 1.7 minutes to light from a thousand-watt quartz lamp positioned about 14 inches from the aperture mask.

During the exposure, light from the lamp is passed through a light pipe or collimator and is projected through the mask causing rays of light to pass through the apertures of the mask and strike upon the film. The irradiated regions of the film harden; that is, become insoluble in water. There is a slight enlargement of the exposed areas above the size of the rays (to about 16 mils) and a graded hardening of the margins of the exposed areas. The exposure through the mask is repeated three times, each time with the light incident as a slightly different angle so that the rays harden the film in groups of three or trios, as in the usual shadowmask-screen manufacture. Substantially less exposure time is required with the novel process as compared with the prior process in which either no diol ether or diol alkane, or no fluorescein or fluorescein salt is present in the film. In some tests, reductions in the exposure time of the order of 65 percent have been achieved.

Following exposure, the assembly is removed from the lighthouse and the mask is separated from the faceplate. The exposed coating is subjected to flushing with a forced spray of water for about 30 seconds, after which the faceplate is rinsed with water and dried. At this point in the process, the faceplate surface carries an adherent stencil comprised of open areas and of dots of hardened polymeric film coated on the surface. The stencil is now overcoated with a composition comprised of light-absorbing particles. In this example, the overcoating is produced by applying to the stencil a slurry containing about 5.0 weight percent of colloidal graphite in water and then drying the overcoating as by applying infrared heat for about 1.5 minutes. After cooling, the overcoating is well adhered both to the polymeric dots and the bare faceplate surface.

Next, a chemically-digestive agent for the polymeric dots is applied to the overcoating. In this example, the digestive agent is an aqueous solution containing about 7 weight percent hydrogen peroxide. This solution may be applied to the overcoating as a wash or as a spray under pressure. The hydrogen peroxide solution penetrates the overcoating and the dots, causing the hardened polyvinyl alcohol of the dots to swell and soften. Subsequent flushing with water removes the softened dots together with the overlying portion of the overcoating, but leaves behind that portion of the overcoating which is adhered directly to the surface of the faceplate. At this point, the faceplate carries a black light-absorbing matrix having a multiplicity of circular holes therethrough about 16 mils in diameter.

The black, light-absorbing matrix is now rinsed with water and dried for about 4 minutes with the aid of an infrared heat. Then, the faceplate is processed in the usual way to deposit red-emitting phosphor dots, green-emitting phosphor dots and blue-emitting phosphor dots about 17 mils in diameter over the holes of the matrix which are about 16 mils in diameter by the usual photographic technique using the same aperture mask as the photomaster in the process. The slight enlargement of the phosphor dots over the holes is achieved by the spreading of light during projection which may be enhanced by increasing the photographic exposure time. The completed screen has a matrix with holes therein and phosphor dots substantially concentric therewith. A suitable process for depositing phosphor dots is described in an article entitled, "Color Television Screening by the Slurry Process," by T. A. Saulnier, Jr. in ELECTROCHEMICAL TECHNOLOGY, 4, 27–31 (1966). The phosphor screen is now filmed and aluminized in the usual way to produce a reflective metal layer on top of the phosphor dots and the matrix. Then, the screen is baked and assembled with the aperture mask into a cathode-ray tube.

According to the novel method, the presence of NaFl (sodium fluorescein) or other fluorescein-type dyes, when used in conjunction with TEG (triethylene glycol) or other PVA (polyvinyl alcohol) plasticizing materials, will enhance the photosensitivity of dichromated PVA (polyvinyl alcohol) photoresist films by an unexpectedly large amount. This is shown in the TABLE, which gives exposure values expressed as the product of the light intensity I and t, the time required for a normal exposure. The values of the product It in the TABLE are relative values in arbitrary units. The photosensitivity of a film is inversely proportional to the exposure It. The base resist formulation to which varying amounts of NaFl (sodium fluorescein) and TEG (triethylene glycol) were added was:

| Ingredient | Weight Percent |
| --- | --- |
| PVA | 2.400 |
| Acrylic copolymer (AC-73) | 0.360 |
| NaD (sodium dichromate dihydrate) | 0.264 |
| Water | balance to 100 |

The TABLE shows that the addition of NaFl to a non-diol-containing photoresist film increases the photosensitivity of the film by only about 4%, a relatively small amount. As the proportion of TEG increases (TEG/PVA ratio increases), the photosensitivity of the film increases as expected. As the proportion of NaFl increases (NaFl/NaD ratio increases), the photosensitivity of the film increases further by unexpectedly large amounts. Whereas a photoresist film having a TEG/PVA ratio of 0.75 and a NaFl/NaD ratio of 0.00 is about twice as fast as a similar film having a TEG/PVA ratio of 0.00, the addition of NaFl (in addition to TEG) increases the speed to the point where the photoresist film is about five times as photosensitive as it would have been without TEG or NaFl. Both types of additives (fluorescein cosensitizer and PVA plasticizer) are needed. This is probably due to the mechanism being a short-range energy transfer to the dichromate anions from the fluorescein molecules. The PVA plasticizer speeds up the diffusion of the excited fluorescein molecules through the film to the dichromate anions to allow energy transfer to compete effectively with reradiation as fluorescence. The mechanism of the process appears to involve an electronic energy transfer from excited fluorescein molecules to the dichromate anions. This anion state at about 440 nm has a low absorption coefficient for direct utilization of the incident radiation, and the transfer of energy from the more highly-absorbing fluorescein molecules seems to facilitate the photoreduction process. Similar effects have been observed for other PVA plasticizers such as TTEG (tetraethylene glycol) and DEG (diethylene glycol); however, TEG and TTEG seem to be the most effective in their synergistic effect. The novel method can be used to increase photosensitivity, or to reduce TEG level while still maintaining the same sensitivity.

Comparison of circular images made with films with and without sodium fluorescein therein showed no degradation of quality due to the presence of the sodium fluorescein; and in fact, there may be a slight improvement in the definition of the sodium-fluorescein-containing resist film. At high sodium fluorescein levels, the pH of the film will rise, and this will decrease the photosensitivity of the film, which is known to decrease with increasing pH. Also, once a certain optical density is reached, the sensitivity will approach a saturation limit since all incident light is absorbed. One observation of interest is that the sodium-fluorescein-containing film seemed to etch out more readily than a similar resist that is free from fluorescein-type dyes.

The use of NaFl and TEG to reduce the exposure It required for a film containing phosphor particles was examined. Varying amounts of NaFl and TEG were added to the phosphor slurry after sensitization with NaD, and films were prepared from the slurry. The films were exposed and developed as described above. As in the matrix results described above, a saturation effect (due to either high pH or high optical density) was noted. Decreases in exposure time on the order of 25-45% were observed. No application problems were encountered. Tricolor luminescent viewing screens were prepared to test for R/B (red-on-blue) cross-contamination. It was found that additions of NaD and TEG do not further increase R/B cross-contamination; and in fact, it seems to give a slight improvement.

TABLE

EFFECT OF TEG AND SODIUM FLUORESCEIN ON PHOTOSENSITIVITY

| Ratio TEG/PVA | A $\frac{NaFl}{NaD} = 0.00$ | B $\frac{NaFl}{NaD} = 0.25$ | C % It Red. |
| --- | --- | --- | --- |
| 0.00 | $1.52 \times 10^3$ | $1.46 \times 10^3$ | 4.0 |
| 0.25 | $1.065 \times 10^3$ | $9.37 \times 10^2$ | 12.0 |
| 0.50 | $9.61 \times 10^2$ | $6.41 \times 10^2$ | 33.0 |
| 0.75* | $7.50 \times 10^2$ | $3.00 \times 10^2$ | 60.0 |
| 1.00 | Complete WO | Complete WO | — |

*Partial WO (washout) at panel edges, both formulations. Washout is a loss of light-hardened material due to insufficient adherence to the support surface.

I claim:

1. A method for preparing a luminescent screen structure for a cathode-ray tube comprising
   (a) coating a support surface with a film consisting essentially of (i) a dichromatic sensitized polymeric material whose solubility is altered when it is exposed to radiant energy, (ii) at least one member of a first group consisting of diol alkanes and diol ethers, (iii) and at least one member of a second group consisting of fluorescein and fluorescein salts,
   (b) exposing said film to an image in the form of radiant energy until the solubility of the irradiated regions thereof is selectively altered, thereby producing in said film regions of greater solubility regions of lesser solubility,
   (c) and removing those regions of said film with greater solubility,
   (d) coating now bare areas of said support surface and said retained film regions with a composition containing particles of screen-structure material,
   (e) and then removing at least a portion of said retained film regions and the overcoating composition thereon, while retaining the overcoating composition coated on said support surface while retaining those regions of said film of lesser solubility.

2. The method defined in claim 1 wherein said at least one member of said second group comprises about 0.5 to 10 weight percent of the weight of said polymeric material.

3. The method defined in claim 2 wherein said polymeric material is dichromated polyvinyl alcohol.

4. The method defined in claim 3 wherein said first group of material is triethylene glycol.

5. The method defined in claim 4 wherein said second group of material is sodium fluorescein.

6. A method for preparing a luminescent screen structure of a cathode-ray tube comprising
   (a) coating a support surface with a film consisting essentially of (i) a polymeric material whose solubility in an aqueous solvent is altered when it is exposed to radiant energy, said polymeric material consisting essentially of polyvinyl alcohol and a dichromate sensitizer therefor, (ii) at least one member of a first group consisting of diol alkanes and diol ethers, (iii) and at least one member of a second group consisting of fluorescein and fluorescein salts, (b) exposing said film to an image in the form of radiant energy until the solubility of the irradiated regions thereof is selectively altered, thereby producing in said film regions of greater solubility and regions of lesser solubility, (c) removing those regions of said film with greater solubility thereby baring the areas of the support surface underlying said regions of greater solubility, while retaining those regions of said film of lesser solubility.

(d) coating said bare areas of said support surface and said retained film regions with a composition containing particles of screen-structure material, (e) and then removing at least a portion of said retained film regions and the overcoating composition thereon, while retaining the overcoating composition coated on said support surface.

7. The (material) method defined in claim 6 wherein the amount of said (polymeric material consists essentially of polyvinyl alcohol and a) dichromate sensitizer is about 2 to 30 weight percent of the weight of said polyvinyl alcohol (therefor).

8. The method defined in claim 7 wherein said first group of material is triethylene glycol.

9. The method defined in claim 8 wherein said second group of material is sodium fluorescein.

10. The method defined in claim 9 wherein said sodium fluorescein comprises about 0.5 to 10 weight percent of said polyvinyl alcohol.

* * * * *

UNITED STATES PATENT AND TRADEMARK OFFICE
CERTIFICATE OF CORRECTION

PATENT NO. : 4,255,504

DATED : March 10, 1981

INVENTOR(S) : David Fredrik Hakala

It is certified that error appears in the above-identified patent and that said Letters Patent is hereby corrected as shown below:

| | |
|---|---|
| Column 3, line 60 | after "incident" change "as" to --at-- |
| Column 6, line 40 | before "removing" delete "and" |
| Column 6, line 41 | after "solubility" insert --while retaining those regions of said film of lesser solubility-- |
| Column 6, lines 48 and 49 | after "surface" delete "while retaining those regions of said film of lesser solubility" |

Signed and Sealed this

Sixteenth Day of June 1981

[SEAL]

Attest:

RENE D. TEGTMEYER

Attesting Officer

Acting Commissioner of Patents and Trademarks